(12) United States Patent
Chen et al.

(10) Patent No.: US 8,139,397 B2
(45) Date of Patent: Mar. 20, 2012

(54) SPATIAL CORRELATION OF REFERENCE CELLS IN RESISTIVE MEMORY ARRAY

(75) Inventors: Yiran Chen, Eden Prairie, MN (US); Hai Li, Eden Prairie, MN (US); Wenzhong Zhu, Apple Valley, MN (US); Xiaobin Wang, Chanhasssen, MN (US); Henry Huang, Apple Valley, MN (US); Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/968,438

(22) Filed: Dec. 15, 2010

(65) Prior Publication Data

US 2011/0080769 A1    Apr. 7, 2011

Related U.S. Application Data

(63) Continuation of application No. 12/398,256, filed on Mar. 5, 2009, now Pat. No. 7,876,599.

(60) Provisional application No. 61/109,960, filed on Oct. 31, 2008.

(51) Int. Cl.
*G11C 11/00* (2006.01)
(52) U.S. Cl. ........................................ 365/148; 365/158
(58) Field of Classification Search .......................... None
See application file for complete search history.

(56) References Cited

U.S. PATENT DOCUMENTS

| | | | |
|---|---|---|---|
| 7,187,577 B1 | 3/2007 | Wang | |
| 7,224,601 B2 | 5/2007 | Panchula | |
| 7,233,537 B2 | 6/2007 | Tanizaki | |
| 7,272,034 B1 | 9/2007 | Chen | |
| 7,272,035 B1 | 9/2007 | Chen | |
| 7,286,395 B2 | 10/2007 | Chen | |
| 7,289,356 B2 | 10/2007 | Diao | |
| 7,345,912 B2 | 3/2008 | Luo | |
| 7,379,327 B2 | 5/2008 | Chen | |
| 7,502,249 B1 | 3/2009 | Ding | |
| 7,515,457 B2 | 4/2009 | Chen | |
| 7,755,936 B2 | 7/2010 | Wecker | |
| 2004/0109353 A1* | 6/2004 | Matsuoka | 365/185.2 |
| 2007/0007536 A1 | 1/2007 | Hidaka | |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |

* cited by examiner

*Primary Examiner* — Hoai V Ho
*Assistant Examiner* — James G Norman
(74) *Attorney, Agent, or Firm* — Mueting Raasch & Gebhardt PA

(57) ABSTRACT

The present disclosure relates to methods of selectively placing a reference column or reference row in a memory array. The method includes measuring a resistance state resistance value for a plurality of variable resistive memory cells within a memory array and mapping a location of each measured variable resistive memory cell to form a map of the resistance state resistance values for a plurality of variable resistive memory cells within a memory array. Then a column or row is selected to be a reference column or reference row based on the map of the resistance state resistance value for a plurality of variable resistive memory cells within a memory array, to minimize read operation errors, and forming a variable resistive memory cell memory array.

20 Claims, 7 Drawing Sheets

SPATIAL CORRELATION OF REFERENCE CELLS IN RESISTIVE MEMORY ARRAY

CROSS-REFERENCE TO RELATED APPLICATIONS

This application claims the benefit of U.S. application Ser. No. 12/398,256 filed Mar. 5, 2009 and which is based off of Provisional Application No. 61/109,960 filed Oct. 31, 2008, the contents of which is hereby incorporated by reference in its entirety.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces significant scaling problems.

Resistive sense memories are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe. Resistive RAM (RRAM) is another resistive sense memory that has a variable resistance layer that can switch between a high resistance state and a low resistance state (for example by the presence or absence of a conductive filament) by applicant of a current or voltage.

Spin polarization current induced magnetization switching has been introduced to the MRAM design. Spin-Transfer Torque RAM (STRAM), uses a (bidirectional) current through the MTJ to realize the resistance switching. The switching mechanism of STRAM is constrained locally and STRAM is believed to have a better scaling property than the conventional MRAM.

However, a number of yield-limiting factors must be overcome before STRAM enters the production stage. One concern is that it can be difficult to reliably read the STRAM from cycle to cycle and from bit to bit in a memory array. One read technique to sense the state of an STRAM bit is to inject a small current through the bit and measure the voltage at the end of a bit line, then compare it with a reference voltage, $V_{ref}$. Ideally, one would like to have $V_{ref}$ situated at a voltage value midpoint between the $V_{high}$ and $V_{low}$ distributions. However, due to fabrication process variation of the memory array, the electrical property value of each memory cell in the memory array can deviate from the designed value.

BRIEF SUMMARY

The present disclosure relates to resistive memory arrays with reference cells. In particular the present disclosure relates to variable resistive memory cell arrays that include a reference memory cell that is selectively placed in the array to provide a reliable read operation based on spatial correlation analysis of an electrical property map of the memory array. These methods are particularly suitable for use with spin-transfer torque memory cells.

In an illustrative embodiment, a method includes measuring a resistance state resistance value for a plurality of variable resistive memory cells within a memory array and mapping a location of each measured variable resistive memory cell to form a map of the resistance state resistance values for a plurality of variable resistive memory cells within a memory array. Then a column or row is selected to be a reference column or reference row based on the map of the resistance state resistance value for a plurality of variable resistive memory cells within a memory array, to minimize read operation errors, and forming a variable resistive memory cell memory array.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to resistive memory arrays with reference cells. In particular the present disclosure relates to variable resistive memory cell arrays that include a reference memory cell that is selectively placed in the array to provide a reliable read operation based on electrical property map of the memory array. These memory arrays are particularly suitable for use with spin-transfer torque memory cells. The methods described herein improve the read operation of variable resistive memory cell arrays. By determining the spatial correlation among the variable resistive memory cells at different location on the array, the memory cell row or column with high correlation is used as the reference cell row or column to improve the reliability of the read operation. The disclosed reference cell location determination method intentionally increases the correlation between the resistance of the reference cell and the sensed memory cell. These methods can efficiently reduce read failure by reducing the variation of the read sensing margin. While the present disclosure is not so limited, an appreciation of various aspects of the disclosure will be gained through a discussion of the examples provided below.

Figure 1:
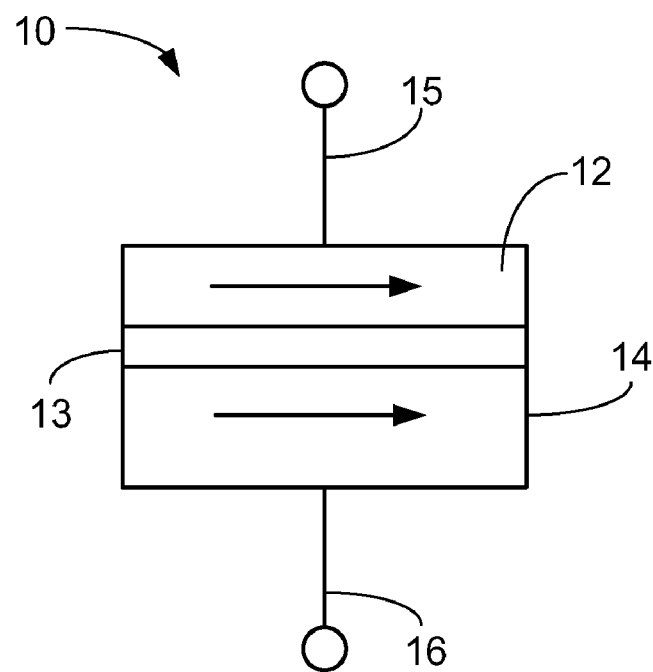
FIG. 1 is a cross-sectional schematic diagram of an illustrative variable resistive memory cell in the low resistance state.
Figure 2:
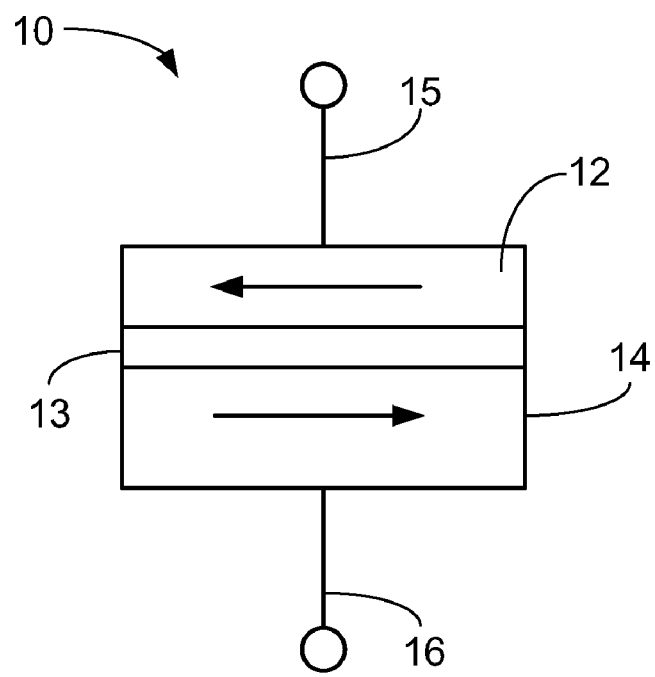
FIG. 2 is a cross-sectional schematic diagram of the illustrative variable resistive memory cell in the high resistance state.

FIG. 1 is a cross-sectional schematic diagram of an illustrative variable resistive memory cell 10 in the low resistance state and FIG. 2 is a cross-sectional schematic diagram of the illustrative variable resistive memory cell 10 in the high resistance state. The variable resistive memory cell can be any useful memory cell that can switch between a high resistance state and a low resistance state (i.e., resistive RAM or RRAM). In many embodiments, the variable resistive memory cell described herein is a spin-transfer torque memory cell (i.e., spin-torque transfer RAM or STRAM). In other embodiments, the variable resistive memory cell described herein is a magneto-resistive memory cell (i.e., MRAM).

In some embodiments, the variable resistive memory cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunnel barrier. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the magnetic tunnel junction data cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the variable resistive memory cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the variable resistive memory cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the variable resistive memory cell 10 via spin-transfer occurs when a current, passing through a magnetic layer of the variable resistive memory cell 10, becomes spin polarized and imparts a spin torque on the free layer 12 of the variable resistive memory cell 10. When a sufficient spin torque is applied to the free layer 12, the magnetization orientation of the free layer 12 can be switched between two opposite directions and accordingly the variable resistive memory cell 10 can be switched between the parallel state (i.e., low resistance state or "0" data state) and anti-parallel state (i.e., high resistance state or "1" data state) depending on the direction of the current.

In some embodiments, the illustrative spin-transfer torque variable resistive memory data cell 10 may be used to construct a memory device that includes multiple variable resistive memory cells where a data bit is stored in magnetic tunnel junction data cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque variable resistive memory data cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Generally, the anisotropy causes a soft and hard axis to form in thin magnetic layers. The hard and soft axes are defined by the magnitude of the energy, usually in the form of a magnetic field, needed to fully rotate (saturate) the direction of the magnetization in that direction, with the hard axis requiring a higher saturation magnetic field.

Figure 3:
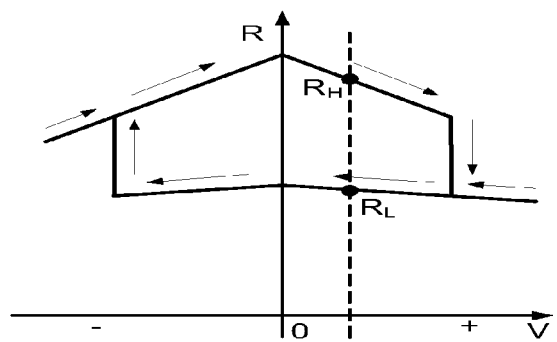
FIG. 3 is a graph of a static R-V sweep curve of a variable resistive memory data cell.

FIG. 3 is a graph of a static R-V sweep curve of a variable resistive memory data cell. When applying a positive voltage on the second electrode 16 in FIG. 1 or 2, the variable resistive memory data cell 10 enters the negative applied voltage region in FIG. 3 and switches from the low resistance state to the high resistance state. When applying a positive voltage on the first electrode 15 in FIG. 1 or 2, the variable resistive memory data cell 10 enters the negative applied voltage region in FIG. 3. The resistance of the variable resistive memory data cell switches from the high resistance state to the low resistance state.

Let $R_H$ and $R_L$ denote the high and low magnet resistance, respectively. We define the Tunneling Magneto Resistance Ratio (TMR) as $TMR=(R_H-R_L)/R_L$. Here $R_H$, $R_L$, and TMR are determined by also the sensing current or voltage, as shown in FIG. 3. Generally, a large TMR makes it easier to distinguish the two resistance states of the variable resistive memory data cell.

Figure 4:
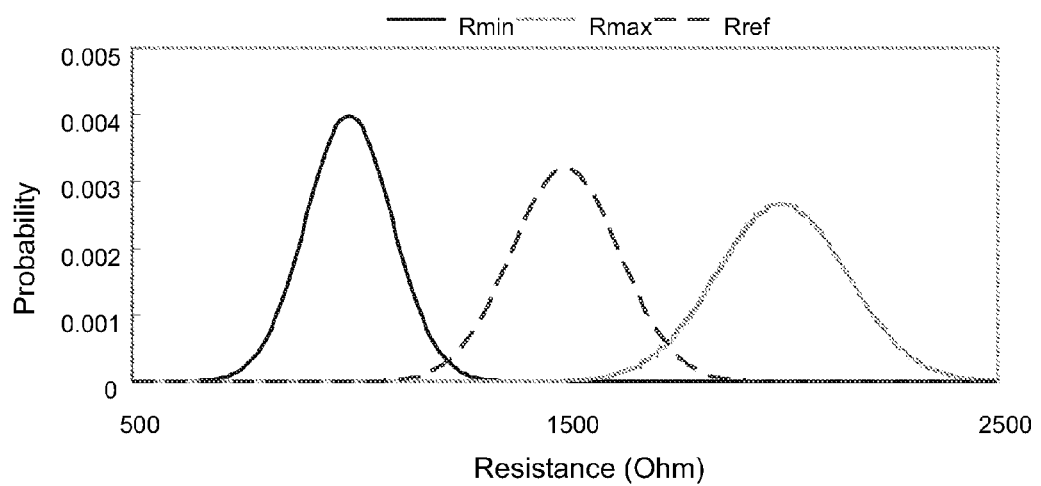
FIG. 4 is graph showing resistance variation of variable resistive memory cell in a memory array.

FIG. 4 is graph showing resistance variation of variable resistive memory cell in a memory array where the reference cell row or column is simply placed on the memory array without performing the method described herein. The reference resistance Rref generated by the reference cells is located between the high resistance Rmax and low resistance Rmin of the variable resistive memory cell in a memory array. The areas where the reference resistance Rref curve overlaps the high resistance Rmax and low resistance Rmin curves denotes a potential read operation failure. The methods described herein can reduce these overlap regions and improve the read reliability of the memory array.

Assume $R_{max}$ and $R_{ref}$ are all normal distributions as:

$$R_{max} \sim N(a, \delta_a^2)$$

$$R_{ref} \sim N(b, \delta_b^2) \quad (1)$$

The difference between $R_{max}$ and $R_{ref}$: $R_{max}-R_{ref}$ denotes the sensing margin. The mean of $R_{max}-R_{ref}$ is:

$$c = E(R_{max}-R_{ref}) = E(R_{max}) - E(R_{ref}) = a-b \quad (2)$$

The variance of $R_{max}-R_{ref}$ is:

$$\delta_c^2 = E((X-Y)^2) - E^2(X-Y) = (\delta_a^2 + \delta_b^2 - 2\rho_{ab} \cdot \delta_a \cdot \delta_b) \quad (3)$$

Here $\rho_{ab}$ is the correlation coefficient between $R_{max}$ and $R_{ref}$. From Eq. (2) and (3), the higher correlation between $R_{max}$ and $R_{ref}$, the smaller the variance of $R_{max}-R_{ref}$ is. As a result, the smaller overlap, or smaller failure rate of read operation can be achieved. In practical STRAM (Spin-transfer torque RAM) or RRAM manufacturing, the correlation coefficient between $R_{max}$ and $R_{ref}$ highly relies on the physical location on the die. Some examples of the possible reasons and the corresponding patterns are: some spatially related CMOS process, e.g., CMP etc.; some special design patterns, e.g., bit line/column, which is affected by the location of via etc.; and some spatially related magnetic process, e.g, lithography of MTJ etc.

In general, two memory cells that are in closer physical proximity have a higher correlation coefficient of their resistance. Different reasons generate different spatial patterns of the resistance variation of memory cells in a memory array. For example, due to the process of the vias connected to a bitline, the resistances of memory cells along this bitline are highly correlated. Another example is the variation of lithography of magnetic tunnel junction data cells, which generates a correlation pattern based on the distance between two memory cells. The final pattern of spatial correlation could be very complex. Therefore, optimally selecting the location of the reference column and/or reference row increases the correlation with the sensed memory cell. Consequently, the variance of sensing margin deceases and the failure rate is reduced.

Figure 5:
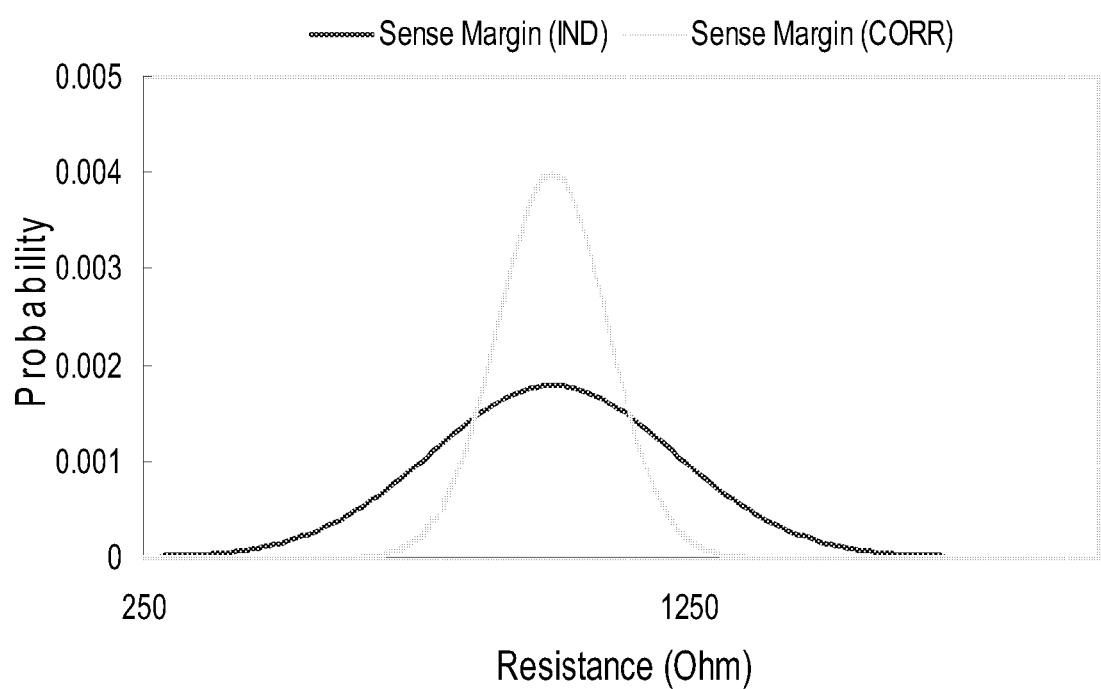
FIG. 5 is a graph of an exemplary sense margin distribution of a memory array and an exemplary sense margin distribution of a memory array that had the reference cells spatially correlated in the memory array.

FIG. 5 is a graph of an exemplary sense margin distribution (Sense Margin (IND)) of a memory array and an exemplary sense margin distribution (Sense Margin (CORR)) of a memory array that had the reference cells spatially correlated in the memory array. Performing the methods described herein narrows the sense margin distribution of the memory cells that form the memory array. This effectively increases the sense margin of the memory cells that form the memory array. As illustrated, the sense margin begins at about 250 Ohm with the non-correlated memory array and at about 750 Ohm with the correlated memory array. Increasing the sense margin of the memory cells that form the memory array can decrease the number of read errors that occur when reading the resistance state of the memory cells that form the memory array.

Figure 6:
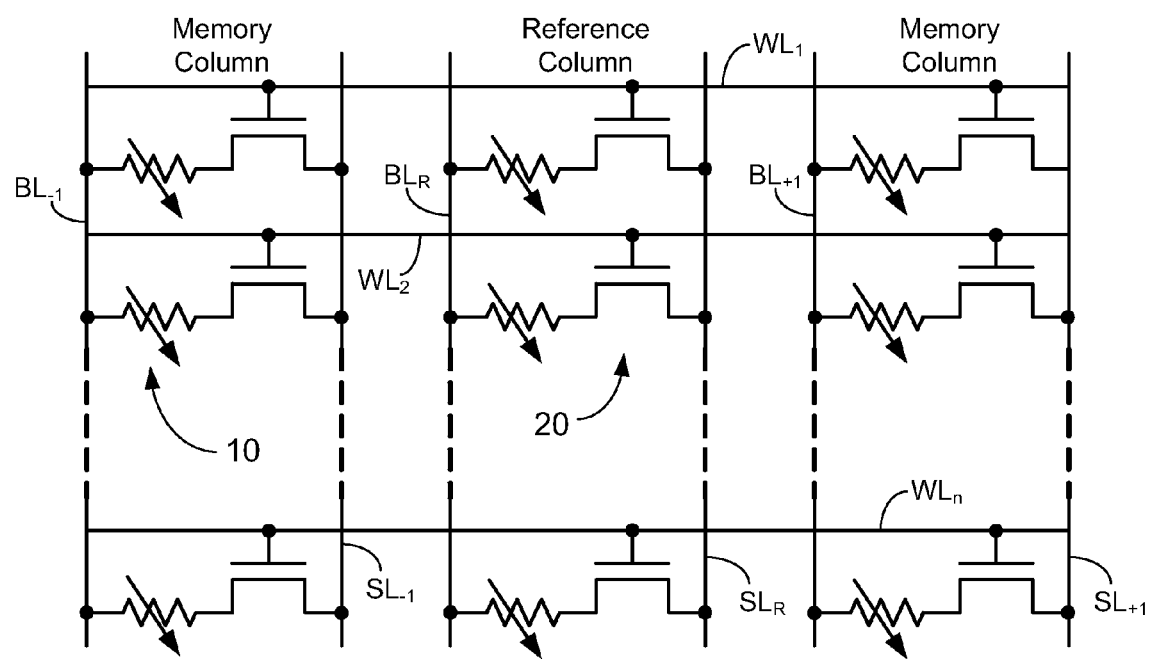
FIG. 6 is a schematic circuit diagram of an embedded reference column in a memory array.

FIG. 6 is a schematic circuit diagram of an embedded reference column in a memory array. The memory array includes a plurality of magnetic tunnel junctions 10 that selectively provide a high resistance state resistance value and a low resistance state resistance value, as described above. Each magnetic tunnel junctions 10 is electrically coupled to a select transistor 20. A gate of each select transistor 20 is electrically coupled to a word line (i.e., $WL_1$, $WL_2$, $WL_n$). Each magnetic tunnel junctions 10 and select transistor 20 are electrically between a source line (i.e., $SL_{-1}$, $SL_R$, $SL_{+1}$) and a bit line (i.e., $BL_{-1}$, $BL_R$, $BL_{+1}$).

The reference column is embedded between the memory columns. The reference column provides a reference resistance that is between the high resistance state resistance value and the low resistance state resistance value. When reading each memory cell, the reference resistance value and the memory cell resistance value is provided to a sense amplifier to determine if the memory cell resistance state is either the low resistance state or the high resistance state.

Placing the reference column within the memory array and between memory columns increases the correlation between the reference column and the memory columns adjacent to the reference column. Consequently, the variance of sensing margin decreases and the read failure rate is reduced. Thus, determining the location of the reference column within the memory array improves the performance of the memory array.

Figure 7:
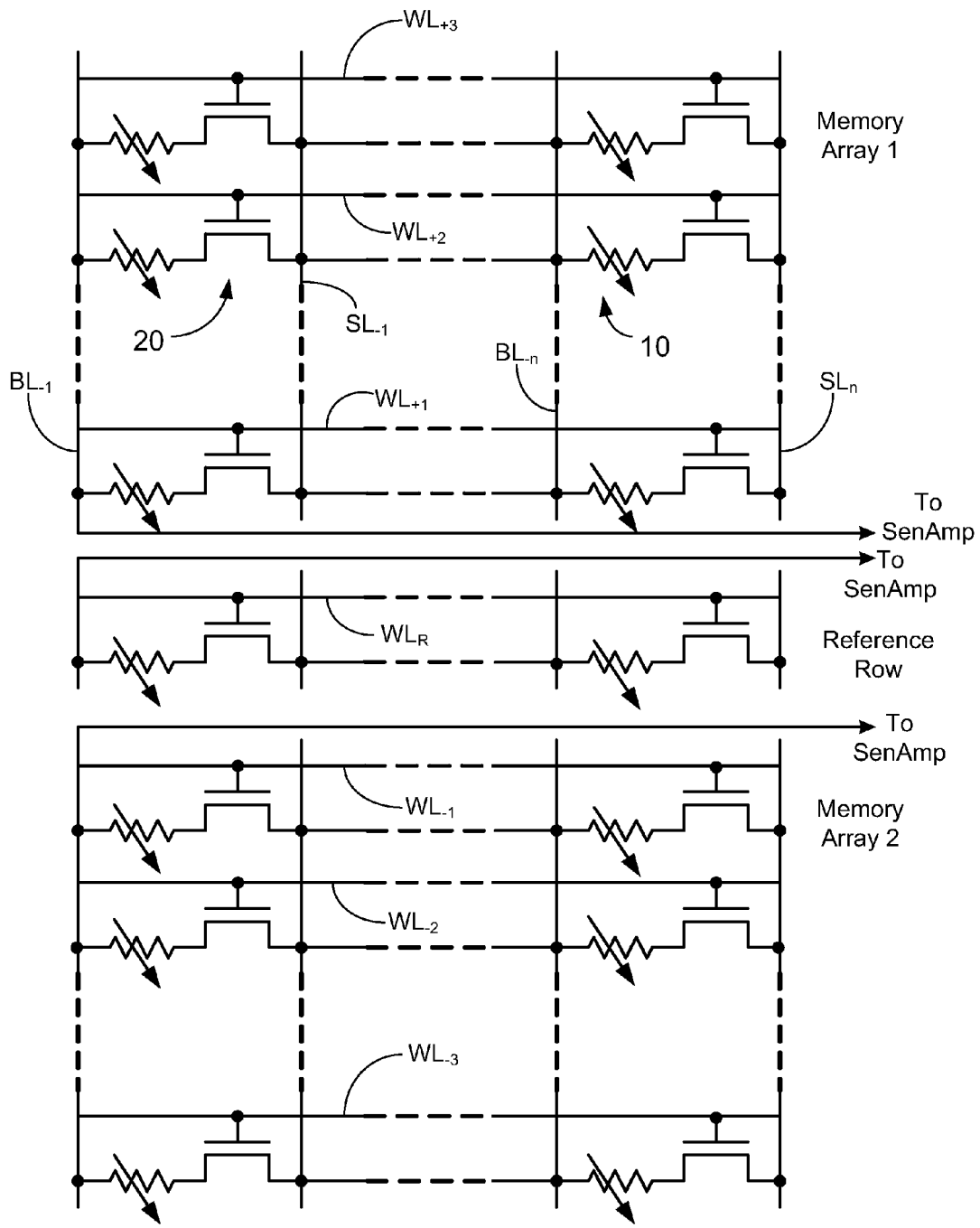
FIG. 7 is a schematic circuit diagram of an embedded reference row in a memory array.

FIG. 7 is a schematic circuit diagram of an embedded reference row in a memory array. The memory array includes a plurality of magnetic tunnel junctions 10 that selectively provide a high resistance state resistance value and a low resistance state resistance value, as described above. Each magnetic tunnel junctions 10 is electrically coupled to a select transistor 20. A gate of each select transistor 20 is electrically coupled to a word line (i.e., $WL_{-1}$, $WL_{-2}$, $WL_{-3}$, $WL_R$, $WL_{+1}$, $WL_{+2}$, $WL_{+3}$). Each magnetic tunnel junctions 10 and select transistor 20 are electrically between a source line (i.e., $SL_{-1}$, $SL_n$) and a bit line (i.e., $BL_1$, $BL_2$).

The reference row is embedded between memory array 1 and memory array 2. The reference row provides a reference resistance that is between the high resistance state resistance value and the low resistance state resistance value. When reading each memory cell, the reference resistance value and the memory cell resistance value is provided to a sense amplifier senamp to determine if the memory cell resistance state is either the low resistance state or the high resistance state.

Placing the reference row within the memory array 1 and memory array 2 increases the correlation between the reference row and the memory array adjacent to the reference row. Consequently, the variance of sensing margin decreases and the read failure rate is reduced. Thus, determining the location of the reference row within the memory array improves the performance of the memory array.

Utilizing the methods described herein, one or more reference row(s) or column(s) can be placed or embedded within a magnetic tunnel junction memory array. Once the one or more reference row(s) or column(s) are located within a magnetic tunnel junction memory array, additional memory arrays can be fabricated on a particular memory array fabrication apparatus. Locating the one or more reference row(s)

or column(s) within a magnetic tunnel junction memory array is accomplished via statistical analysis to determine the spatial correlation of the memory cell resistances to the location of the reference column or row. The spatial correlation data obtained by mapping the resistance values each of the memory cells with the direction and distance of each memory cell from each other is used to allocate the location of the reference row or column.

Figure 8A:
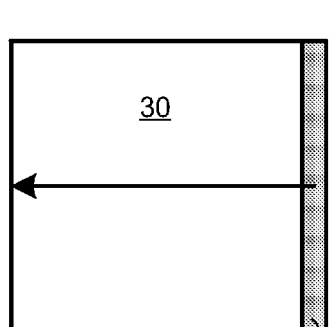
FIG. 8A-8F are schematic diagrams of reference column or row placement in a memory array.

FIG. 8A-8F are schematic diagrams of reference column or row placement in a memory array. FIG. 8A illustrates a memory array 30 having a reference column $R_C$ along a right edge of the memory array 30. The reference column $R_C$ provides a reference resistance value for all the memory cells to the left of the reference column $R_C$ as shown by the arrow.

Figure 8B:
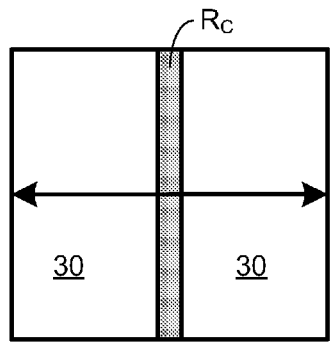

FIG. 8B illustrates a memory array 30 having a reference column $R_C$ embedded within the memory array 30. The reference column $R_C$ provides a reference resistance value for all the memory cells to the left of the reference column $R_C$ as shown by the left arrow and the reference column $R_C$ provides a reference resistance value for all the memory cells to the right of the reference column $R_C$ as shown by the right arrow.

Figure 8C:
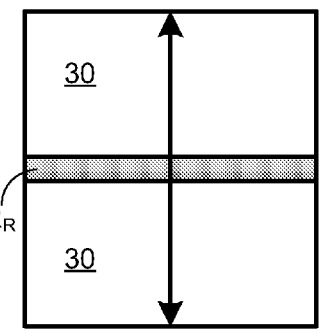

FIG. 8C illustrates a memory array 30 having a reference row $R_R$ embedded within the memory array 30. The reference row $R_R$ provides a reference resistance value for all the memory cells above the reference row $R_R$ as shown by the up arrow and the reference row $R_R$ provides a reference resistance value for all the memory cells below the reference row $R_R$ as shown by the down arrow.

Figure 8D:
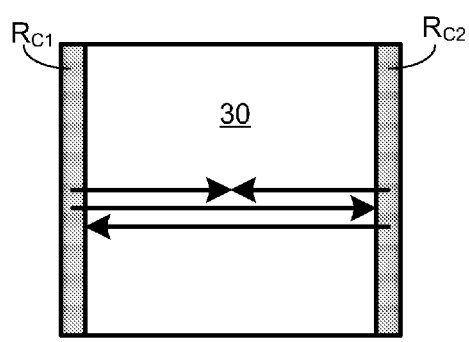

FIG. 8D illustrates a memory array 30 having a reference column $R_{C2}$ along a right edge of the memory array 30 and a reference column $R_{C1}$ along a left edge of the memory array 30. The reference columns $R_{C1}$ $R_{C2}$ provides a reference resistance value for all the memory cells between the reference columns $R_{C1}$ $R_{C2}$ as shown by the arrows. In some embodiments, the right reference column $R_{C2}$ provides a reference resistance value for a right half of the memory array the left reference column $R_{C1}$ provides a reference resistance value for a left half of the memory array. In other embodiments, each reference column can independently provide a reference resistance value for the entire memory array 30.

Figure 8E:
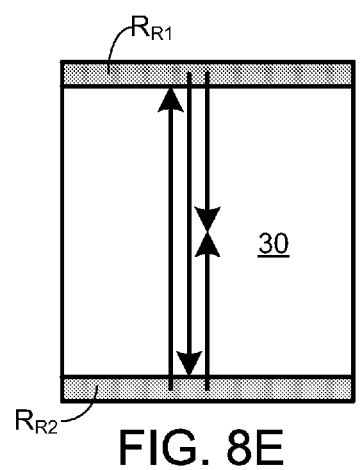

FIG. 8E illustrates a memory array 30 having a reference row $R_{R2}$ along a bottom edge of the memory array 30 and a reference row $R_{R1}$ along a top edge of the memory array 30. The reference rows $R_{R1}$ $R_{R2}$ provides a reference resistance value for all the memory cells between the reference columns $R_{R1}$ $R_{R2}$ as shown by the arrows. In some embodiments, the top reference column $R_{R2}$ provides a reference resistance value for a top half of the memory array and the bottom reference row $R_{C1}$ provides a reference resistance value for a bottom half of the memory array. In other embodiments, each reference row can independently provide a reference resistance value for the entire memory array 30.

Figure 8F:
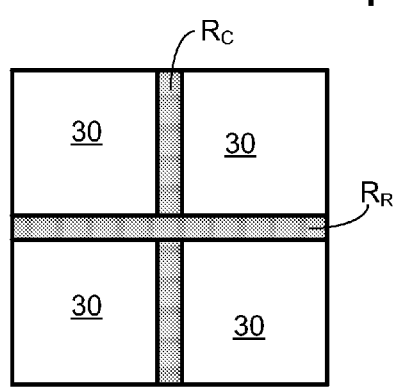

FIG. 8F illustrates a memory array 30 having a reference row $R_R$ embedded within the memory array 30 and a reference column $R_C$ embedded within the memory array 30. The reference row $R_R$ and the reference column $R_C$ can independently provides a reference resistance value for all the memory cells in the memory array 30.

Figure 9:
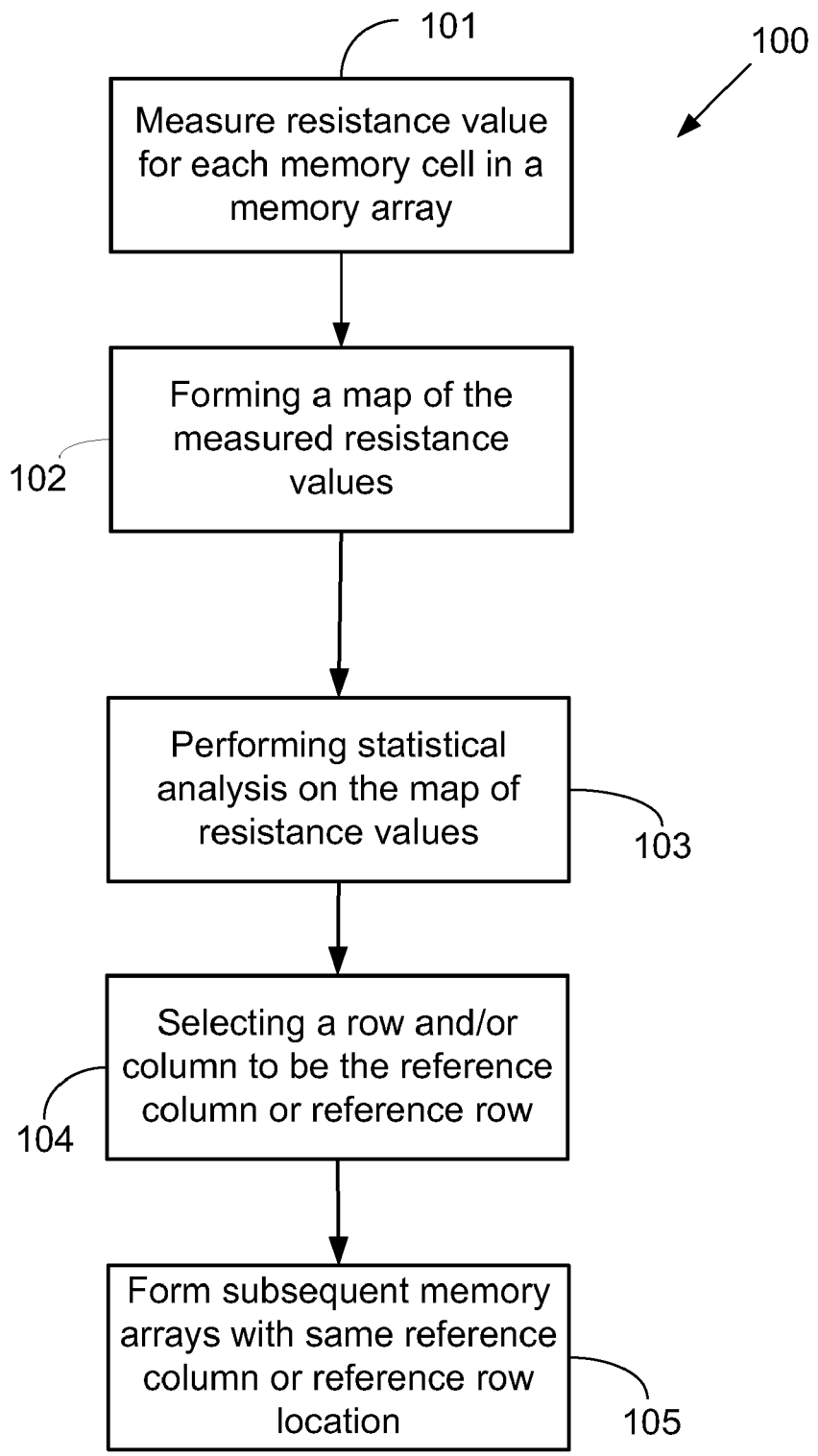
FIG. 9 is a flow diagram of an illustrative method of selectively placing a reference column or reference row in a memory array.

FIG. 9 is a flow diagram of an illustrative method of selectively placing a reference column or reference row in a memory array 100. The method includes measuring a resistance state resistance value for a plurality of magnetic tunnel junction data cells within a memory array at block 101. In some embodiments the high resistance state resistance value is measured. In some embodiments the low resistance state resistance value is measured. In some embodiments both the high and low resistance state resistance values are measured. These resistance values are then analyzed utilizing statistical analysis to determine the best column and/or row to designate as the reference column and/or reference row.

The relative location and resistance value of each measured memory cell in the memory array can be mapped to form a map of the resistance state resistance values a plurality of magnetic tunnel junction data cells within a memory array at block 102. Creating this map forms a "topography" of resistance values and allows for an analysis of a correlation of distance between memory cells and required correlation between memory cells.

Statistical analysis is then preformed based on the map "topography" or resistance values at block 103. This analysis can provide a spatial correlation of the memory array that determines the best location for one or more reference columns and/or reference rows. The spatial correlation analysis can include determining relative distance, direction and resistance value of each measured magnetic tunnel junction data cell in the map of the resistance state resistance values.

The method then includes selecting a column or row in the memory array to be a reference column or reference row based on the map of the resistance state resistance value for a plurality of magnetic tunnel junction data cells within a memory array, to minimize read operation errors, and forming a magnetic tunnel junction data cell memory array at block 104. Subsequent memory arrays can then be formed utilizing the reference row or column "template" determined above. Since each memory array fabrication device can have it own unique memory array fabrication process variation across the memory array that is consistent for each memory array formed by that fabrication device, a reference column or reference row memory array template can be unique to each fabrication device. Thus, the method described herein allows for reference column or reference row unique location determination for each memory array fabrication device. The methods described herein can reduce the sensing failure by reducing the variation of sensing margin.

Sometime the number of reference columns and/or reference rows may be increased by inserting more reference columns and/or reference rows into the memory array to reduce the distance between the reference cell and the sensed cell. Usually the spatial correlation of memory cell can be pre-characterized as described above. In general these steps include: 1. Determine the relation between the correlation coefficient of the resistance of memory cell and the distance from the statistic data; 2. Based on the required correlation coefficient for a certain read reliability, certain distance between the memory cell and reference cell, as well as the direction (vertical or horizontal etc.) of the reference cell are determined. 3. Based on the determined distance and direction, the reference cell (i.e., as a reference column and/or reference row) is allocated on the die.

An example of the distributions of sense margins with independent $R_{min}/R_{ref}$ and full correlated $R_{min}/R_{ref}$ is shown in FIG. 5. A resistance value larger than zero means the successful read operation. A larger variation for independent $R_{min}/R_{ref}$ incurs a higher failure rate.

The reference level generation methods described herein improve the reliability of the read mechanism in resistive memory such as MRAM, STRAM, and RRAM based on the potential spatial correlation existing in the memory bit cell and CMOS device/process. By analyzing the spatial correlation among the memory bit cell and CMOS devices at different locations on the die, the memory cell with high correlation is used as the reference cell to improve the reliability of read scheme of a resistive memory array.

Thus, embodiments of the SPATIAL CORRELATION OF REFERENCE CELLS IN RESISTIVE MEMORY ARRAY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method, comprising:
    measuring a resistance state resistance value for a plurality of variable resistive memory cells within a memory array; and
    selecting a column or row in the memory array to be a reference column or reference row based on the measured resistance state resistance values within the memory array, to minimize read operation errors, and forming a variable resistive memory cell memory array.

2. A method according to claim 1, wherein the resistance state resistance value comprises a high resistance state resistance value.

3. A method according to claim 1, wherein the resistance state resistance value comprises a low resistance state resistance value.

4. A method according to claim 1, wherein the resistance state resistance value comprises a low resistance state resistance value and a high resistance state resistance value.

5. A method according to claim 1, wherein the selecting step comprises selecting two or more columns or rows in a memory array to be reference columns or reference rows.

6. A method according to claim 1, further comprising forming subsequent variable resistive memory cell memory arrays having the reference column or row placed in the memory array at the selected column or row location in the variable resistive memory cell memory array.

7. A method according to claim 1, wherein the selecting step comprises selecting two or more columns or rows in the memory array to be reference columns or reference rows based on the measured resistance state resistance values within the memory array.

8. A method according to claim 1, wherein the selecting step comprises selecting at least one column and at least one row in the memory array to be a reference column and a reference row based on the measured resistance state resistance values within the memory array.

9. A method according to claim 1, wherein the selecting step comprises performing a spatial correlation analysis of the measured resistance state resistance values within the memory array.

10. A method according to claim 9, wherein the spatial correlation analysis comprises determining relative distance, direction and resistance value of each measured variable resistive memory in the map of the resistance state resistance values.

11. A method according to claim 1, wherein the selecting step increases a sensing margin of the memory array.

12. A method, comprising:
    measuring a high resistance state resistance value and a low resistance state resistance value for a plurality of magnetic tunnel junction data cells within a memory array; and
    selecting a column or row in the memory array to be a reference column or reference row based on the measured resistance state resistance values within the memory array, to increase a sense margin of the memory array and minimize read operation errors, and forming a magnetic tunnel junction data cell memory array.

13. A method according to claim 12, wherein the selecting step comprises selecting two or more columns or rows in a memory array to be reference columns or reference rows.

14. A method according to claim 12, further comprising forming subsequent magnetic tunnel junction data cell memory arrays having the reference column or row placed in the memory array at the selected column or row location in the magnetic tunnel junction data cell memory array.

15. A method according to claim 12, wherein the selecting step comprises selecting two or more columns or rows in the memory array to be reference columns or reference rows based on the measured resistance state resistance values within the memory array.

16. A method according to claim 12, wherein the selecting step comprises selecting at least one column and at least one row in the memory array to be a reference column and a reference row based on the measured resistance state resistance values within the memory array.

17. A method according to claim 12, wherein the selecting step comprises performing a spatial correlation analysis of the measured resistance state resistance values within the memory array.

18. A method of placing a reference column or reference row in a memory array, comprising the steps of:
    measuring a resistance value for a plurality of spin-transfer torque memory cells within a memory array;
    performing statistical analysis on the measured resistance values to determine a spatial correlation of the measured resistance values; and
    selecting a column or row in the memory array to be a reference column or reference row based on the statistical analysis of the measured resistance state resistance value within the memory array, to increase a sense margin of the memory array and minimize read operation errors, and forming a spin-transfer torque memory array.

19. A method according to claim 18, wherein the selecting step comprises selecting two or more columns or rows in a memory array to be reference columns or reference rows.

20. A method according to claim 18, further comprising forming subsequent spin-transfer torque memory cell memory arrays having the reference column or row placed in the memory array at the selected column or row location in the spin-transfer torque memory array.

* * * * *